(12) United States Patent
Bichan et al.

(10) Patent No.: US 9,300,277 B2
(45) Date of Patent: Mar. 29, 2016

(54) APPARATUS FOR REDUCING PERIODIC JITTER IN A RING OSCILLATOR

(71) Applicants: Michael E. Bichan, Toronto (CA); Robert H. Wang, Toronto (CA)

(72) Inventors: Michael E. Bichan, Toronto (CA); Robert H. Wang, Toronto (CA)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 14/108,952

(22) Filed: Dec. 17, 2013

(65) Prior Publication Data

US 2015/0171839 A1   Jun. 18, 2015

(51) Int. Cl.
*H03K 3/03* (2006.01)
*H03K 3/013* (2006.01)

(52) U.S. Cl.
CPC ............ *H03K 3/0315* (2013.01); *H03K 3/013* (2013.01)

(58) Field of Classification Search
CPC ......... H03L 7/10; H03L 7/18; H03L 2207/06; H03L 2207/50; H03L 7/07; H03L 7/0807; H03L 7/0816; H03L 7/085; H03L 7/087; H03L 7/0893; H03L 7/0896; H03L 7/091; H03L 7/093; H03L 7/1075; H03L 7/187; H03K 5/133; H03K 2005/00208; H03K 3/0322; H03K 5/1565; H03K 2005/00032; H03K 5/13; H03K 3/0315; H03K 3/013
USPC .............. 331/57, 177 R, 34, 175, 183
See application file for complete search history.

(56) References Cited

U.S. PATENT DOCUMENTS

| 5,442,325 | A | 8/1995 | Bosshart |
| 5,502,418 | A | 3/1996 | Arai |
| 5,563,554 | A | 10/1996 | Mizuno |
| 5,767,748 | A | 6/1998 | Nakao |
| 7,501,904 | B2 * | 3/2009 | Fan ............ H03K 5/133 331/177 R |
| 7,587,179 | B1 * | 9/2009 | Groe et al. .......... 455/108 |
| 7,948,330 | B2 * | 5/2011 | Seo et al. .......... 331/186 |
| 2006/0001496 | A1 | 1/2006 | Abrosimov et al. |

OTHER PUBLICATIONS

PCT/US2014/061384 Notification of Transmittal of the International Search Report and the Written Opinion of the International Searching Authority, mailed Jan. 13, 2015, 11 pages.

* cited by examiner

*Primary Examiner* — Arnold Kinkead
(74) *Attorney, Agent, or Firm* — Blakely, Sokoloff, Taylor & Zafman LLP

(57) ABSTRACT

A method and apparatus for reducing jitter in a ring oscillator are described. In one embodiment, the apparatus comprises a first power supply node to provide power supply current; a ring oscillator, coupled to the first power supply node, to generate an oscillating output according to change in the power supply current provided to the ring oscillator; and a second power supply node; a circuit, coupled to the second power supply node, to replicate time-average (e.g., DC) behavior of the ring oscillator; and a feedback mechanism having inputs coupled to the first and second power supply nodes, and an output to control current in the circuit.

11 Claims, 5 Drawing Sheets

APPARATUS FOR REDUCING PERIODIC JITTER IN A RING OSCILLATOR

BACKGROUND

Conventional way to generate a low jitter clock at high data rates is to use an LC (inductor-capacitor) oscillator. While LC oscillators may achieve very low jitter, the inductor required can occupy a large area depending on the desired frequency of oscillation. For a serializer/de-serializer application with many lanes on a chip, VCO (voltage controlled oscillator) pulling can become a concern when inductors are in close proximity. VCO pulling is an effect which is realized when one oscillator can affect the oscillation frequency of another oscillator. While techniques are known to overcome this problem, these techniques occupy additional area and degrade performance. In addition, LC-VCO center frequency can be process-dependent, requiring respins when the VCO frequency is higher or lower than targeted. A "respin" is an additional manufacturing run in which the design is slightly changed, in this case so that a certain performance characteristic can be achieved. Generally, respins are to be avoided since they delay product readiness.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figures 1, 2:
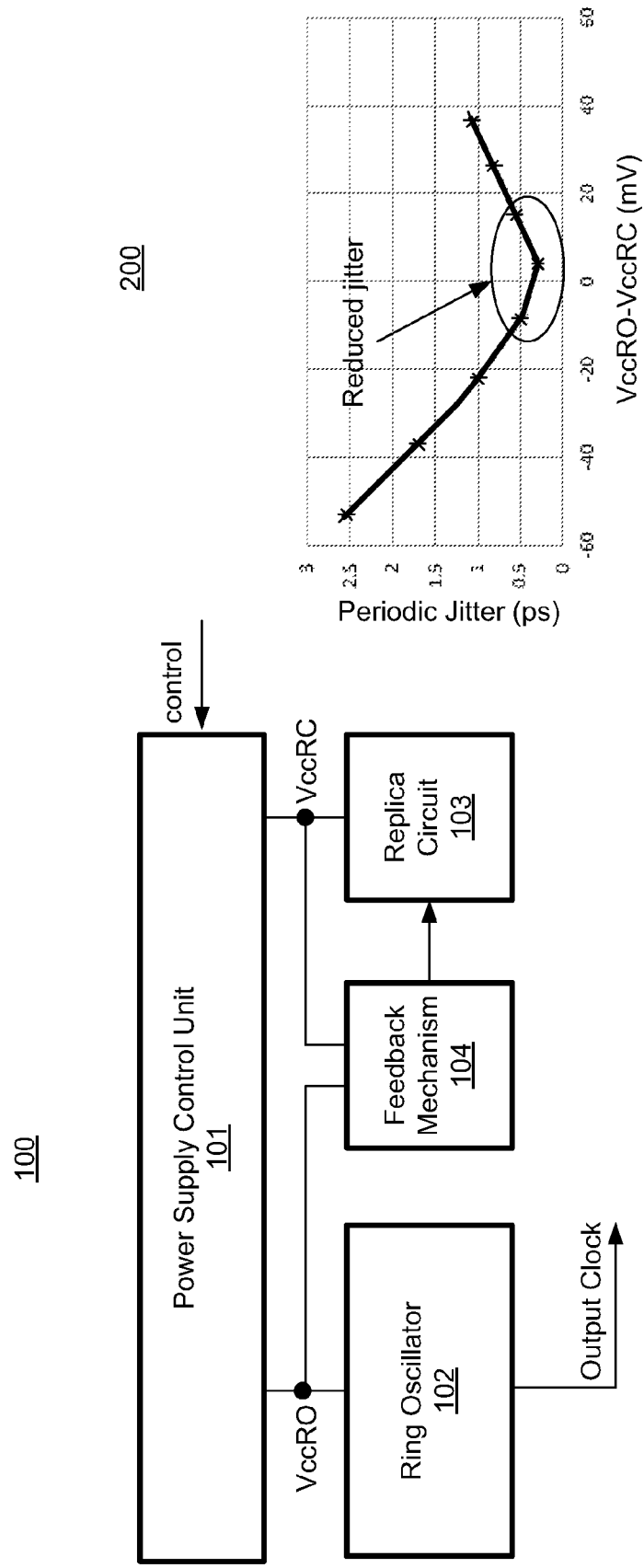
FIG. 1 illustrates an apparatus for reducing periodic clock jitter in a ring oscillator, according to one embodiment of the disclosure.
FIG. 2 illustrates a plot showing reduced jitter when difference between power supplies to the ring oscillator and a replica circuit is reduced, according to one embodiment of the disclosure.

The embodiments describe an apparatus for reducing periodic clock jitter in a ring oscillator. In one embodiment, an apparatus comprises a first power supply node to provide power supply current. In one embodiment, the apparatus further comprises a ring oscillator, coupled to the first power supply node, to generate an oscillating output according to change in the power supply current provided to the ring oscillator. In one embodiment, the apparatus further comprises a circuit (e.g., a replica circuit), coupled to a second power supply node, to replicate DC behavior of the ring oscillator. In one embodiment, the apparatus comprises a feedback mechanism (e.g., an operational amplifier) having inputs coupled to the first and second power supply nodes, and an output to control current in the circuit (i.e., replica circuit). In one embodiment the replica circuit and operational amplifier feedback provide an equi-potential node (e.g., node VccRC of FIG. 3) to switch the current to. In one embodiment, by substantially matching the first and second power supplies, periodic jitter on the output of the ring oscillator caused by switching current is reduced.

The embodiments describe a low jitter clock source. The embodiments may be used for serializer/de-serializer applications in smaller area and without the possibility of VCO pulling that exists with LC oscillators. Previous solutions typically use LC oscillator to generate a low jitter clock at data rates exceeding 5 Gb/s. The embodiments allow the use of ring oscillator that can generate a low jitter clock for use in applications having high data rates (e.g., 32 Gb/s).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates an apparatus 100 for reducing periodic clock jitter in a ring oscillator, according to one embodiment of the disclosure. In one embodiment, apparatus 100 comprises Power Supply Control Unit 101, Ring Oscillator (RO) 102, Replica Circuit 103, and Feedback Mechanism 104.

In one embodiment, Power Supply Control Unit 101 receives control signals (e.g., Up/Dn signals) that indicate whether frequency of Output Clock should be increased or decreased, or kept constant. In one embodiment, Power Supply Control Unit 101 includes circuits for generating power supplies VccRO and VccRC. Here, VccRO is the power supply for RO 102 while VccRC is the power supply for Replica Circuit 103. In one embodiment, Power Supply Control Unit 101 is operable to (via control signals) modulate current of power supply VccRO to change the oscillating frequency of Output Clock.

For example, when control signal indicates that Output Clock frequency should increase, then Power Supply Control Unit 101 increases current to node VccRO which speeds up Output Clock. Likewise, when control signal indicates that Output Clock frequency should decrease, then Power Supply Control Unit 101 decreases current to node VccRO (also referred here as the first power supply node) which slows down Output Clock. Here, labels for signals and nodes are interchangeably used. For example, VccRO is referred for VccRO node or VccRO power supply depending on the context of the sentence. One embodiment of Power Supply Control Unit 101 is described with reference to FIG. 3.

Referring back to FIG. 1, RO 102 is any ring oscillator. For example, RO 102 may comprise a series of inverters or buffers with an odd number of inversions coupled together in a loop such that the output signal is fed back as input. RO 102 may be implemented with an even number of differential buffers with an inversion realized by swapping differential signals in one of the buffer stages. Other implementations of RO 102 may be used that allow modulation of Output Clock from RO 102 according to change in current of its supply node.

In one embodiment, Replica Circuit 103 is coupled to VccRC (also referred to as the second power supply node). In one embodiment, current associated with VccRC is also modulated according to control signal just like current associated with VccRO is modulated. In one embodiment, Replica Circuit 103 replicates DC behavior of RO 102. In one embodiment, for Replica Circuit 103 to mimic impedance of RO 102, the transistors in Replica Circuit 103 when taken together have a static voltage-current characteristic which is substantially similar to the time-average of the voltage-current characteristics of the transistors in RO 102. One embodiment of Replica Circuit 103 is described with reference to FIG. 3.

In one embodiment, Feedback Mechanism 104 monitors VccRO and VccRC and generates an output to adjust current strength of Replica Circuit 103 such that VccRC is made nearly equal to VccRO (e.g., within 0.5% of each other). In one embodiment, Feedback Mechanism 104 is an operational amplifier. In one embodiment, the operational amplifier includes built in offset cancellation apparatus to improve accuracy of the amplifier. In one embodiment, the offset of the operational amplifier is cancelled or calibrated by digital means. In one embodiment, once the operational amplifier is calibrated, VccRC to Replica Circuit 103 matches (i.e., become equal or substantially equal) VccRO despite process or temperature variation. One embodiment of Feedback Mechanism 104 is described with reference to FIG. 3.

Referring back to FIG. 1, when a phase locked loop (PLL) uses current controlled RO 102, current is switched in or out of RO 102 in response to a feedback signal that is proportional to a phase difference between an input Reference Clock (Ref Clock) and a divided Feedback Clock (Fb Clock). In one embodiment, this proportional information is provided by control signal(s) to Power Supply Control Unit 101. In one embodiment, Replica Circuit 103 acts as a sink for current to switch away from RO 102 to reduce periodic jitter in Output Clock by maintaining VccRO and VccRC to be at substantially equal voltage levels. In one embodiment, Replica Circuit 103 is a static circuit to avoid interfering with Output Clock from RO 102. In one embodiment, Replica Circuit 103 has an impedance characteristic that substantially matches the impedance characteristic of RO 102 over a range of input current values (here, input current being the current injected or removed from VccRO node).

FIG. 2 illustrates a plot 200 showing reduced jitter when difference between power supplies to the ring oscillator and a replica circuit is reduced, according to one embodiment of the disclosure. FIG. 2 is described with reference to FIG. 1. Here, x-axis is a voltage difference in millivolts (mV) between VccRO and VccRC, and y-axis is periodic jitter in picoseconds (ps). Jitter referred to in this paragraph is absolute jitter, where phase is measured with respect to that of an ideal clock. Total jitter is subdivided into deterministic jitter and random jitter. Deterministic jitter is further subdivided into data-dependent jitter and periodic jitter. Periodic jitter is generally jitter that recurs at a particular frequency and is unrelated to any data signals present. While periodic jitter can occur at any frequency, an important source of periodic jitter in PLLs occurs at the same frequency as the reference clock.

Plot 200 shows that as difference between VccRO and VccRC is reduced, periodic jitter also reduces. Periodic jitter is substantially zero (e.g., eliminated) when difference between VccRO and VccRC is substantially zero (e.g., within 0.5% of each other). In one embodiment, Feedback Mechanism 104 in conjunction with Replica Circuit 103 reduces the voltage difference between VccRO and VccRC such that VccRC is made substantially equal to VccRO. In such an embodiment, periodic jitter in Output Clock is reduced.

Figure 3A:
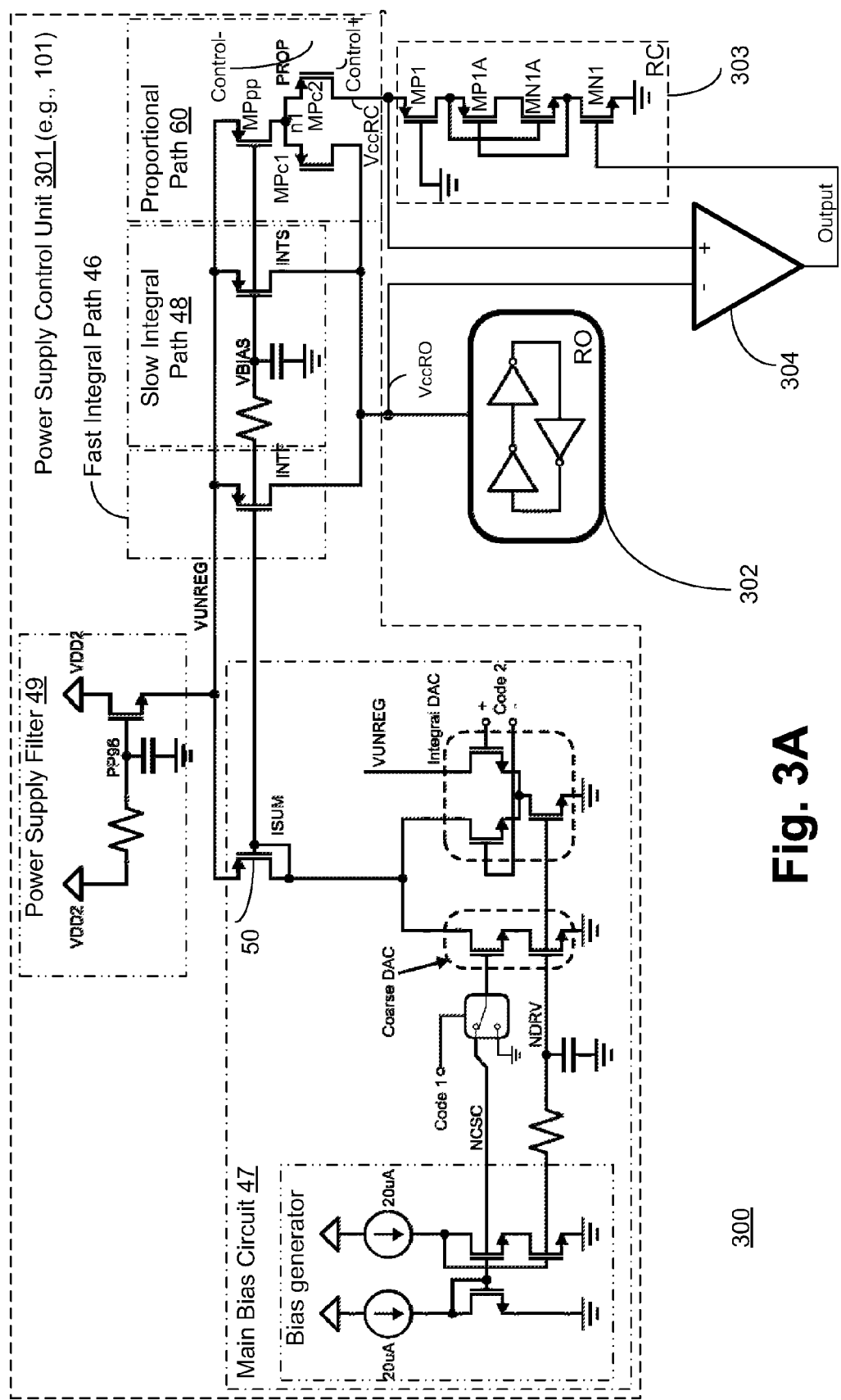
FIG. 3A illustrates a circuit of the apparatus for reducing periodic clock jitter in a ring oscillator, according to one embodiment of the disclosure.

FIG. 3A illustrates a circuit 300 of the apparatus for reducing periodic clock jitter in a ring oscillator, according to one embodiment of the disclosure. It is pointed out that those elements of FIG. 3A having the same reference numbers (or names) as the elements of any other figure can operate or function in any manner similar to that described, but are not limited to such.

In one embodiment, circuit 300 comprises Power Supply Control Unit 301 (e.g., 101), RO 302 (which is one example of RO 102), Replica Circuit (RC) 303 (which is one embodiment of Replica Circuit 103), and operational amplifier 304 (which is one embodiment of Feedback Mechanism 104).

In one embodiment, Replica Circuit (RC) 303 comprises p-type transistors MP1, MP1A; and n-type transistors MN1 and MN1A. In one embodiment, source terminal of MP1 is coupled to VccRC node, gate terminal of MP1 is coupled to ground (or a bias voltage), and drain terminal of MP1 is coupled to source terminal of MP1A. In one embodiment, drain terminal of MP1A is coupled to drain terminal of MN1A, and gate terminal of MP1A is coupled to drain terminal of MN1. In one embodiment, source terminal of MN1A is coupled to drain terminal of MN1. In one embodiment, gate terminal of MN1A is coupled to drain terminal of MP1. In one embodiment, source terminal of MN1 is coupled to ground while gate terminal of MN1 is coupled to "Output" node of Feedback Mechanism 304.

In one embodiment, Feedback Mechanism 304 is an operation amplifier (OPAMP). In one embodiment, OPAMP 304 is a single stage amplifier. In other embodiments, OPAMP 304 is a multi-stage amplifier. In one embodiment, OPAMP 304 includes built-in offset cancellation apparatus (e.g., chopper). In one embodiment, positive input terminal of OPAMP 304 is coupled to VccRC node, while negative input terminal of OPAMP 304 is coupled to VccRO. In one embodiment, OPAMP 304 adjusts "Output" to control drive strength of MN1 such that voltage of VccRC is substantially equal to voltage of VccRO (e.g., within 0.5% of each other).

In this embodiment, RO 302 is an odd number of inverters powered by VccRO and coupled to form a ring. In other embodiments, other types of architectures for RO may be used such that the oscillating frequency of RO 302 is controllable by change in current in VccRO.

In one embodiment, Power Supply Unit 301 comprises a Fast Integral Path 46; Main Bias Circuit 47; Slow Integral Path 48; Power Supply Filter 49, Proportional Path 60.

In one embodiment, control circuitry 47 is coupled between a supply voltage rail VUNREG and a reference or ground rail $V_{SS}$. In one embodiment, a control circuitry 47 comprises a diode which is formed with transistor 50 (i.e., FET 50) having its drain coupled to its gate. In one embodiment, control circuitry 47 comprises two digital-to-analog converters (DACs) (i.e., Coarse DAC and Integral DAC) which are coupled in parallel between the drain node of FET 50 and respective current sources which are coupled to $V_{SS}$.

In one embodiment, the respective current sources are biased by NDRV which is generated by a Bias Generator. In one embodiment, Bias Generator includes reference current sources (e.g., 20 µA current sources). In one embodiment, Coarse DAC transistor is biased by NCSC (i.e., NMOS cascode bias voltage) through a transmission gate or pass gate. In one embodiment, Integral DAC comprises a pair of n-type devices coupled to a current source, where gate terminal of the n-type devices receive Code 2. In one embodiment, the Code 2 is generated by a digital signal processing (DSP) circuit (e.g., 403 of FIG. 4).

In this embodiment, the Coarse DAC provides a steady state current injection which is programmable based on input Code 1 (e.g., four bit). In one embodiment, the current level from the Coarse DAC is set during an initial calibration of RO 302 Output Clock signal. In one embodiment, the Integral DAC receives Code 2 (e.g., an eight bit code) from a Sigma Delta modulator (not shown) which, for example, may be fed in at a 600 MHz clock frequency to modulate the gate voltage signal ISUM.

In one embodiment, diode FET 50 mirrors the current from the two DACs to Fast Integral Path 46. In one embodiment, Fast integral Path 46 comprises one or more p-type FETs coupled to VUNREG and VccRO. In one embodiment, signal ISUM is delivered to Fast Integral Path 46. In one embodiment, the signal ISUM then passes through a low pass filter (having a resistor and capacitor) to provide a signal Vbias to one or more transistors of Slow Integral Path 48. In one embodiment, the one or more transistors of Slow Integral Path 48 are coupled to VUNREG and VccRO. In this embodiment, the signal Vbias controls current passing through Slow Integral Path 48. The signal Vbias is also fed to the Proportional Path 60.

In one embodiment, Proportional Path 60 comprises p-type transistors MPpp, MPcs1, and Mpcs2. In one embodiment, Vbias from Slow Integral Path 48 is received by gate terminal of MPpp. In one embodiment, source terminal of MPpp is coupled to VUNREG. In one embodiment, drain terminal (i.e., node n1) of MPpp is coupled to source terminals of MPc1 and Mpc2. In one embodiment, Control signal (i.e., Control+ and Control−) is received by gate terminals of MPc1 and MPc2. In one embodiment, Control signal is generated by a phase frequency detector (PFD). For example, Control+ may indicate UP signal from PFD while Control− may indicate DOWN (DN) from the PFD.

In one embodiment, drain terminal of MPc1 is coupled to VccRO. In one embodiment, drain terminal of MPc2 is coupled to VccRC. In one embodiment, Power Supply Filter 49 comprises a low pass filter providing PP96 signal to drive a power gate. Here, PP96 signal is a filtered version of power supply VDD2. In this embodiment, the power gate is coupled to power supplies VDD2 and VUNREG.

In one embodiment, OPAMP 304 causes voltage level of VccRC to be substantially the same as VccRO by controlling current through MN1 of RC 303. In such an embodiment, node n1 of Proportional Path 60 has a constant voltage. This constant voltage allows RC 302 to have reduced periodic jitter. In one embodiment, during the course of normal operation, either MPc1 is ON or MPc2 is ON, but MPc1 and MPc2 are not both ON at the same time. In one embodiment, when MPc1 is ON, node n1 assumes a voltage that is substantially equal to VccRO. In one embodiment, when MPc2 is ON, node n1 assumes a voltage that is substantially equal to VccRC. When VccRO and VccRC are at different voltages, node n1 will alternately be charged up and charged down between two different voltages. The act of charging and discharging node n1 results in charge being transferred from the higher potential node (either VccRC or VccRO) to the lower potential node. This charge transfer into or out of the ring oscillator occurs periodically at the reference clock frequency and results in a frequency deviation in Output Clock. To eliminate this undesired frequency deviation, Feedback Mechanism maintains VccRO and VccRC at the same voltage which ensures that node n1 stays at a constant voltage and avoids charge transfer from VccRC to VccRO or from VccRO to VccRC.

Figure 3B:
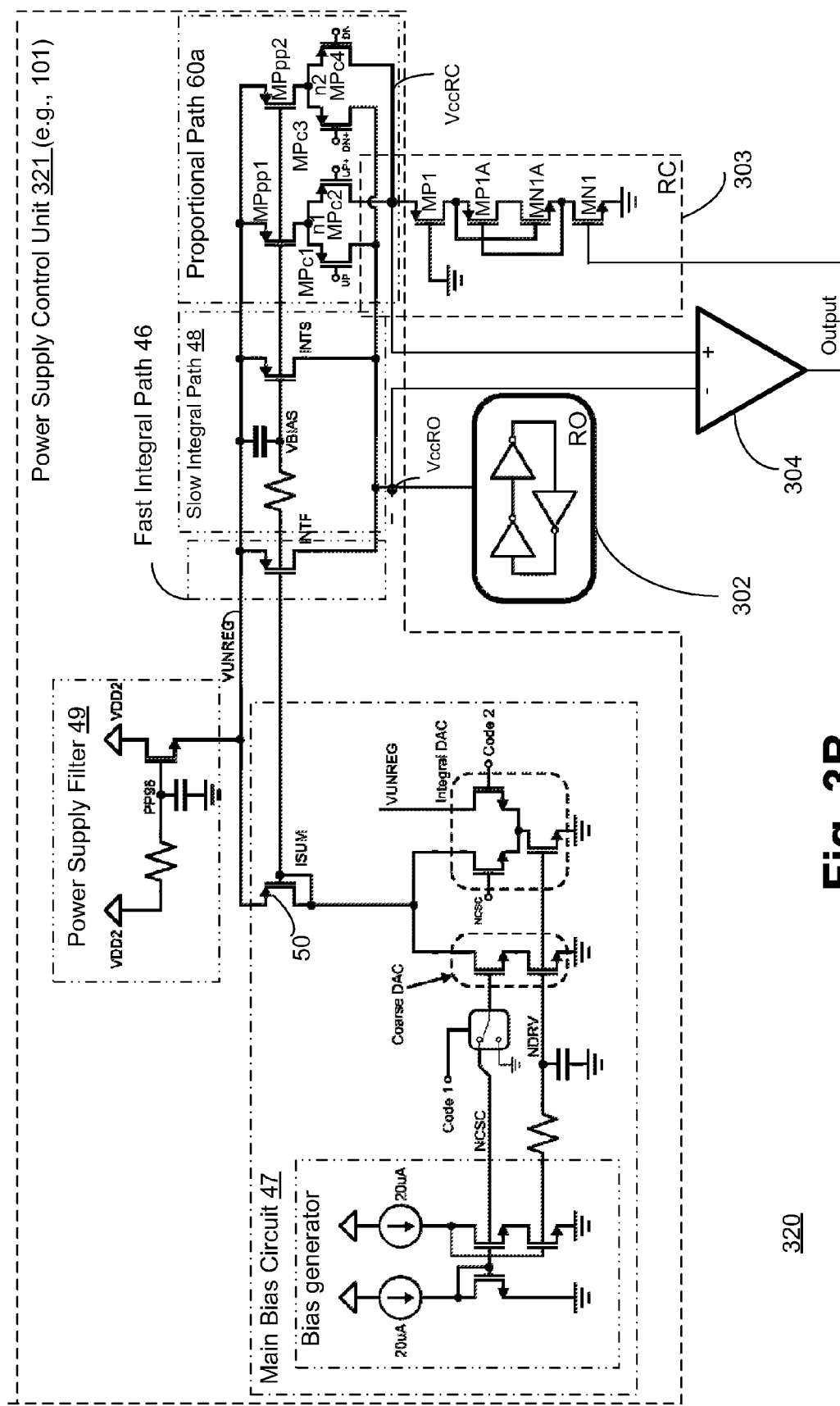
FIG. 3B illustrates a circuit of the apparatus for reducing periodic clock jitter in a ring oscillator, according to another embodiment of the disclosure.

FIG. 3B illustrates a circuit 320 of the apparatus for reducing periodic clock jitter in a ring oscillator, according to another embodiment of the disclosure. It is pointed out that those elements of FIG. 3B having the same reference numbers (or names) as the elements of any other figure can operate or function in any manner similar to that described, but are not limited to such.

Circuit 320 is similar to Circuit 300 except for some differences. So as not to obscure the embodiment of circuit 320 previously discussed elements are not repeated. In this embodiment, Power Supply Control Unit 321 is different from Power Supply Control Unit 301 in that the Proportional Path is a dual differential circuit. i.e., Proportional Path 60 of FIG. 3A is replaced with Proportional Path 60a. In this embodiment, the Integral DAC connections are also changed. For example, the n-type transistor to the right is now controlled by Code 2 while the n-type transistor to the left is biased by NCSC.

In one embodiment, Proportional Path 60a comprises p-type transistors MPpp1, MPpp2, MPcs1, Mpcs2, Mpcs3, and Mpcs4. In one embodiment, Vbias from Slow Integral Path 48 is received by gate terminals of MPpp1 and Mpp2. In one embodiment, source terminals of MPpp1 and Mpp2 are coupled to VUNREG. In one embodiment, drain terminal (i.e., node n1) of MPpp1 is coupled to source terminals of MPc1 and Mpc2. In one embodiment, Control signal (i.e., UP+ and UP−) is received by gate terminals of MPc1 and MPc2. In one embodiment, Control signal (i.e., UP+ and UP−) is generated by a phase frequency detector (PFD). In one embodiment, drain terminal of MPc1 is coupled to VccRO. In one embodiment, drain terminal of MPc2 is coupled to VccRC.

In one embodiment, drain terminal (i.e., node n2) of MPpp2 is coupled to source terminals of MPc3 and Mpc4. In one embodiment, Control signal (i.e., DN+ and DN−) is received by gate terminals of MPc3 and MPc4. In one embodiment, Control signal (i.e., DN+ and DN−) is generated by the PFD. In one embodiment, drain terminal of MPc3 is coupled to VccRO. In one embodiment, drain terminal of MPc4 is coupled to VccRC.

The operation of MPc1, MPc2, and node n1 is similar to that explained with reference to FIG. 3A. Referring back to FIG. 3B, in one embodiment, during the course of normal operation, either MPc3 is ON or MPc4 is ON, but MPc3 and MPc4 are not both ON at the same time. In one embodiment, when MPc3 is ON, node n2 assumes a voltage that is substantially equal to VccRO. In one embodiment, when MPc4 is ON, node n2 assumes a voltage that is substantially equal to VccRC. When VccRO and VccRC are at different voltages, node n2 will alternately be charged up and charged down between two different voltages. The act of charging and discharging node n2 results in charge being transferred from the higher potential node (either VccRC or VccRO) to the lower potential node. This charge transfer into or out of the ring oscillator occurs periodically at the reference clock frequency and results in a frequency deviation in Output Clock. To eliminate this undesired frequency deviation, Feedback Mechanism maintains VccRO and VccRC at the same voltage which ensures that node n2 stays at a constant voltage and avoids charge transfer from VccRC to VccRO or from VccRO to VccRC.

Figure 4:
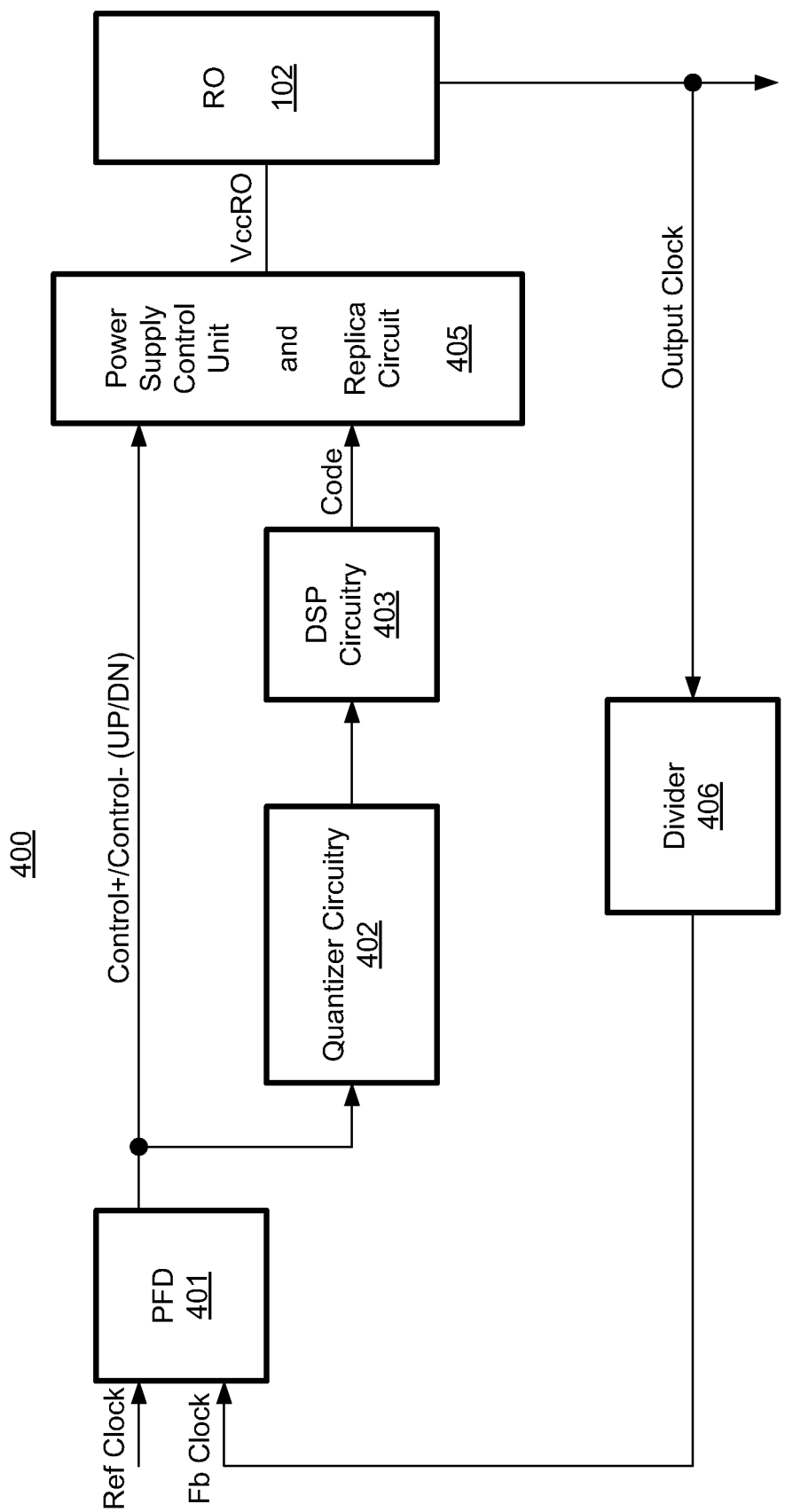
FIG. 4 illustrates a phase locked loop (PLL) with apparatus for reducing periodic clock jitter in a ring oscillator, according to one embodiment of the disclosure.

FIG. 4 illustrates a PLL 400 with apparatus for reducing periodic clock jitter in a ring oscillator, according to one embodiment of the disclosure. It is pointed out that those elements of FIG. 4 having the same reference numbers (or names) as the elements of any other figure can operate or function in any manner similar to that described, but are not limited to such.

In one embodiment, PLL 400 comprises phase frequency detector (PFD) 401, Quantizer Circuitry 402, DSP Circuitry 403, Power Supply Control Unit and Replica Circuit 405, RO 102, Divider 406. In one embodiment, RO 102 outputs Output Clock having a frequency according to phase difference between Ref Clock and Fb Clock but not solely due to this difference. In one embodiment, frequency of the Output Clock is a multiple 'N' of the Ref Clock signal frequency. To effect phase and frequency control of the RO 102, a copy of the Output Clock is factored with divide by N Divider 406 to provide Fb Clock as an input PFD 401.

In one embodiment, Power Supply Control Unit and Replica Circuit 405, which is positioned between the RO 102 and the PFD 401, receives inputs both directly and indirectly from the output of PFD 401. In one embodiment, output of PFD 401 is Control signal (i.e., Control+/Control−) which corresponds to UP and DN (down) signals. In one embodiment, Power Supply Control Unit and Replica Circuit 405 include the Feedback Mechanism 104 which causes VccRC to be substantially equal to VccRO. One technical effect of having VccRC being substantially equal to VccRO is that periodic jitter in Output Clock is substantially reduced.

Figure 5:
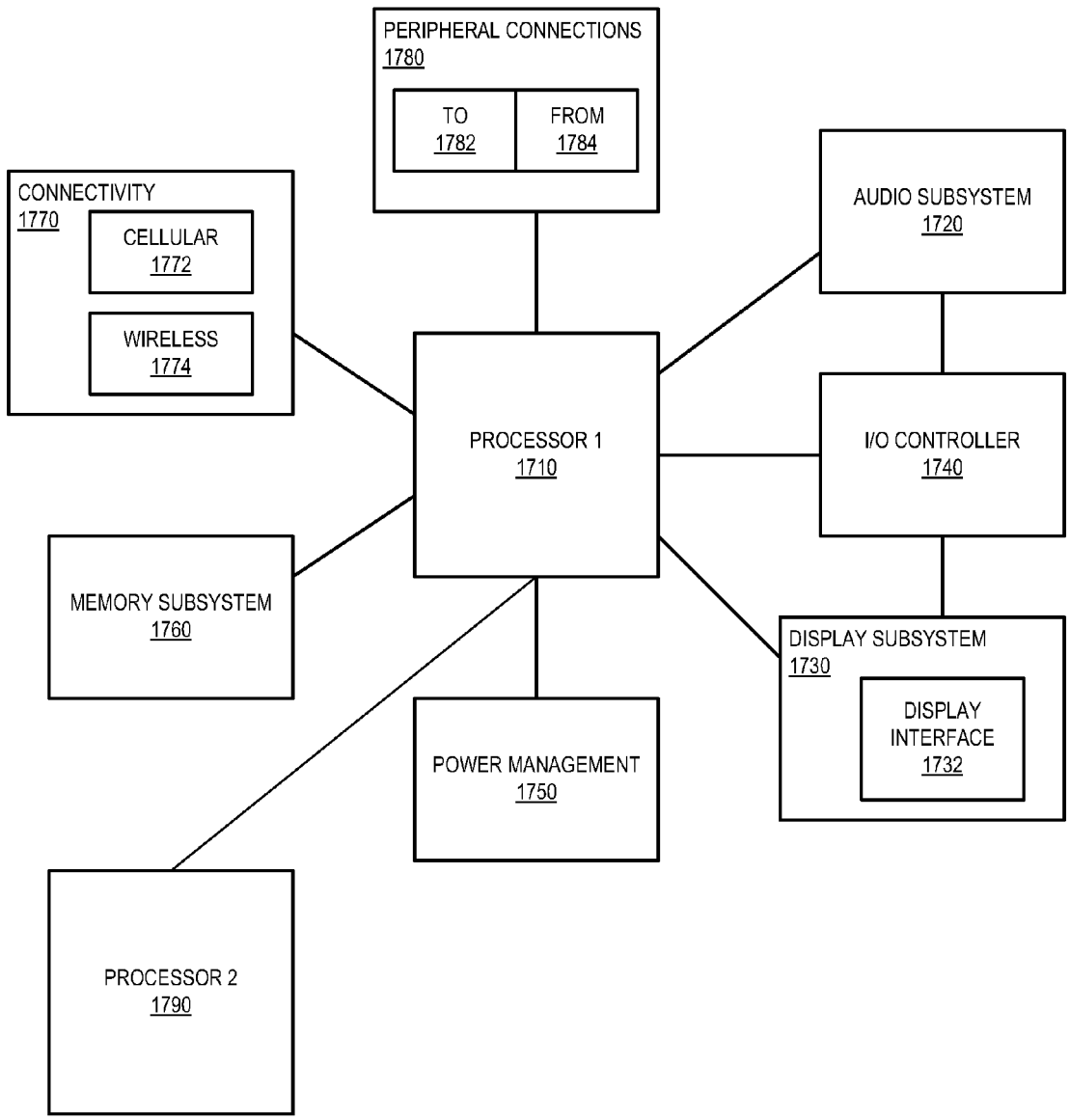
FIG. 5 is a smart device or a computer system or an SoC (System-on-Chip) with apparatus for reducing periodic clock jitter in a ring oscillator, according to one embodiment of the disclosure.

FIG. 5 is a smart device or a computer system or an SoC (System-on-Chip) with apparatus for reducing periodic clock jitter in a ring oscillator, according to one embodiment of the disclosure. It is pointed out that those elements of FIG. 5 having the same reference numbers (or names) as the elements of any other figure can operate or function in any manner similar to that described, but are not limited to such.

FIG. 5 illustrates a block diagram of an embodiment of a mobile device in which flat surface interface connectors could be used. In one embodiment, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In one embodiment, computing device 1700 includes a first processor 1710 with apparatus for reducing periodic clock jitter in a ring oscillator described with reference to embodiments discussed. Other blocks of the computing device 1700 may also include apparatus for reducing periodic clock jitter in a ring oscillator described with reference to embodiments discussed. The various embodiments of the present disclosure may also comprise a network interface within 1770 such as a wireless interface so that a system embodiment may be incorporated into a wireless device, for example, cell phone or personal digital assistant.

In one embodiment, processor 1710 (and processor 1790) can include one or more physical devices, such as microprocessors, application processors, microcontrollers, programmable logic devices, or other processing means. The processing operations performed by processor 1710 include the execution of an operating platform or operating system on which applications and/or device functions are executed. Processor 1790 may be optional. The processing operations include operations related to I/O (input/output) with a human user or with other devices, operations related to power management, and/or operations related to connecting the computing device 1700 to another device. The processing operations may also include operations related to audio I/O and/or display I/O.

In one embodiment, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In one embodiment, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In one embodiment, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first power supply node to provide power supply current; a ring oscillator, coupled to the first power supply node, to generate an oscillating output according to change in the power supply current provided to the ring oscillator; and a second power supply node; a circuit, coupled to the second power supply node, to replicate time-average behavior of the ring oscillator; and a feedback mechanism having inputs coupled to the first and second power supply nodes, and an output to control current in the circuit.

In one embodiment, the feedback mechanism comprises an operational amplifier. In one embodiment, the operational amplifier includes offset cancellation apparatus. In one embodiment, the circuit comprises: a first p-type device coupled to the second power supply; a second p-type device coupled in series to the first p-type device; a first n-type device coupled in series to the second p-type device; a second n-type device coupled to series to the first n-type device, the second n-type device controllable by the output of the feedback mechanism. In one embodiment, the first p-type device has a gate terminal coupled to ground.

In one embodiment, the second p-type device has a gate terminal coupled to a drain terminal of the second n-type device. In one embodiment, the first n-type device has a gate terminal coupled to a drain terminal of the first p-type device. In one embodiment, the apparatus further comprises: a first current source to provide current to the first and second power supply nodes; and a first p-type pass-gate coupled to the first current source and the second power supply, the first p-type pass-gate controllable by a first signal generated by a phase detector.

In one embodiment, the apparatus further comprises: a second p-type pass-gate coupled to the first current source and the first power supply, the second p-type pass-gate controllable by a second signal, which is an inverse of the first signal, wherein the circuit to cause a node coupling the first current source to the first and second p-type pass-gates to have substantially constant voltage as the first signal and the second signal toggle. In one embodiment, the apparatus further comprises: a second current source to provide current to the first and second power supply nodes; and a third p-type pass-gate coupled to the second current source and the second power supply, the third p-type pass-gate controllable by a third signal generated by a phase detector.

In one embodiment, the apparatus further comprises: a fourth p-type pass-gate coupled to the second current source and the first power supply, the fourth p-type pass-gate controllable by a fourth signal, which is an inverse of the third signal, wherein the circuit to cause a node coupling the second current source to the third and fourth p-type pass-gates to have substantially constant voltage as the third signal and the fourth signal toggle.

In another example, a system is provided which comprises: a memory unit; a processer coupled to the memory unit, the processor including a phase locked loop having an apparatus according to the apparatus discussed above. In one embodiment, the system further comprises a wireless interface for allowing the processor to communicate with another device. In one embodiment, the system further comprises a display unit. In one embodiment, the display unit is a touch screen.

In another example, an apparatus is provided which comprises: a circuit, coupled to a second power supply node, to replicate time-average behavior of a ring oscillator; and a feedback mechanism having inputs coupled to first and second power supply nodes, and an output to control current in the circuit. In one embodiment, the ring oscillator is coupled to the first power supply node, the ring oscillator to generate an oscillating output according to change in power supply current provided to the ring oscillator by the first power supply node. In one embodiment, the feedback mechanism comprises an operational amplifier.

In another example, a system is provided which comprises: a memory unit; a processer coupled to the memory unit, the processor including a phase locked loop having an apparatus according to the apparatus discussed above. In one embodiment, the system further comprises a wireless interface for allowing the processor to communicate with another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first power supply node to provide power supply current;
   a ring oscillator, coupled to the first power supply node, to generate an oscillating output according to change in the power supply current provided to the ring oscillator; and
   a second power supply node;
   a circuit, coupled to the second power supply node, to replicate time-average behavior of the ring oscillator; and
   a feedback mechanism having inputs coupled to the first and second power supply nodes, and an output to control current in the circuit; and
   wherein the circuit comprises:
   a first p-type device coupled to the second power supply;
   a second p-type device coupled in series to the first p-type device;
   a first n-type device coupled in series to the second p-type device;
   a second n-type device coupled to series to the first n-type device, the second n-type device controllable by the output of the feedback mechanism.

2. The apparatus of claim 1, wherein the first p-type device has a gate terminal coupled to ground.

3. The apparatus of claim 1, wherein the second p-type device has a gate terminal coupled to a drain terminal of the second n-type device.

4. The apparatus of claim 1, wherein the first n-type device has a gate terminal coupled to a drain terminal of the first p-type device.

5. An apparatus comprising:
a first power supply node to provide power supply current;
a ring oscillator, coupled to the first power supply node, to generate an oscillating output according to change in the power supply current provided to the ring oscillator; and
a second power supply node;
a circuit, coupled to the second power supply node, to replicate time-average behavior of the ring oscillator; and
a feedback mechanism having inputs coupled to the first and second power supply nodes, and an output to control current in the circuit; and
a first current source to provide current to the first and second power supply nodes; and
a first p-type pass-gate coupled to the first current source and the second power supply, the first p-type pass-gate controllable by a first signal generated by a phase detector.

6. The apparatus of claim 5 further comprises:
a second p-type pass-gate coupled to the first current source and the first power supply, the second p-type pass-gate controllable by a second signal, which is an inverse of the first signal, wherein the circuit to cause a node coupling the first current source to the first and second p-type pass-gates to have substantially constant voltage as the first signal and the second signal toggle.

7. The apparatus of claim 5 further comprises:
a second current source to provide current to the first and second power supply nodes; and
a third p-type pass-gate coupled to the second current source and the second power supply, the third p-type pass-gate controllable by a third signal generated by a phase detector.

8. The apparatus of claim 7, further comprises:
a fourth p-type pass-gate coupled to the second current source and the first power supply, the fourth p-type pass-gate controllable by a fourth signal, which is an inverse of the third signal, wherein the circuit to cause a node coupling the second current source to the third and fourth p-type pass-gates to have substantially constant voltage as the third signal and the fourth signal toggle.

9. A system comprising:
a memory unit;
a processor coupled to the memory unit, the processor including a phase locked loop including:
wherein the circuit comprises:
a first power supply node to provide power supply current;
a ring oscillator, coupled to the first power supply node, to generate an oscillating output according to change in the power supply current provided to the ring oscillator; and
a second power supply node;
a circuit, coupled to the second power supply node, to replicate time-average behavior of the ring oscillator; and
a feedback mechanism having inputs coupled to the first and second power supply nodes, and an output to control current in the circuit; and
a wireless interface for allowing the processor to communicate with another device; and
wherein the circuit comprises:
a first p-type device coupled to the second power supply;
a second p-type device coupled in series to the first p-type device;
a first n-type device coupled in series to the second p-type device;
a second n-type device coupled to series to the first n-type device, the second n-type device controllable by the output of the feedback mechanism.

10. The system of claim 9, wherein the first p-type device has a gate terminal coupled to ground, wherein the second p-type device has a gate terminal coupled to a drain terminal of the second n-type device, and wherein the first n-type device has a gate terminal coupled to a drain terminal of the first p-type device.

11. A system comprising:
a memory unit;
a processor coupled to the memory unit, the processor including a phase locked loop including:
a first power supply node to provide power supply current;
a ring oscillator, coupled to the first power supply node, to generate an oscillating output according to change in the power supply current provided to the ring oscillator;
a second power supply node;
a circuit, coupled to the second power supply node, to replicate time-average behavior of the ring oscillator;
a feedback mechanism having inputs coupled to the first and second power supply nodes, and an output to control current in the circuit;
a current source to provide current to the first and second power supply nodes;
a first p-type pass-gate coupled to the current source and the second power supply, the first p-type pass-gate controllable by a signal generated by a phase detector; and
a second p-type pass-gate coupled to the current source and the first power supply, the second p-type pass-gate controllable by another signal, which is an inverse of the signal;
a wireless interface for allowing the processor to communicate with another device.

* * * * *